United States Patent [19]

Blalock et al.

[11] Patent Number: 5,291,083

[45] Date of Patent: Mar. 1, 1994

[54] BUCKET BRIGADE ANALOG DELAY LINE WITH VOLTAGE LIMITING FEEDBACK

[75] Inventors: Travis N. Blalock, Santa Clara; Thomas Hornak, Portola Valley, both of Calif.

[73] Assignee: Hewlett-Packard Company, Palo Alto, Calif.

[21] Appl. No.: 3,344

[22] Filed: Jan. 12, 1993

[51] Int. Cl.⁵ .................. H03K 5/13; G11C 19/28
[52] U.S. Cl. ..................... 307/607; 377/57; 377/59; 377/62; 377/63
[58] Field of Search ............... 307/607; 377/57, 59, 377/62, 63

[56] References Cited

U.S. PATENT DOCUMENTS

| | | | |
|---|---|---|---|
| 3,676,711 | 7/1972 | Ahrons | 307/607 |
| 3,991,322 | 11/1976 | Bush et al. | 307/607 |
| 4,139,784 | 2/1979 | Saver | 377/57 |
| 4,218,665 | 8/1980 | Fujisaki | 377/57 |
| 4,962,512 | 10/1990 | Kiuchi | 377/57 |
| 5,029,189 | 7/1991 | Sato et al. | 377/59 |

OTHER PUBLICATIONS

F. L. J. Sangster, "The '1 bucket-brigade delay line', a shift register for analogue signals", Philips Technical Review, vol. 31, 1970, No. 4, pp. 97-110.
F. L. J. Sangster, "Integrated bucket-brigade delay line using MOS tetrodes", Philips Technical Review, vol;. 31, p. 266.
C. N. Berglund et al., "Performance Limitations of the IGFET Bucket-Brigade Shift Register", IEEE Transactions on Electron Devices, vol. Ed-19, No. 7, Jul. 1972, pp. 852-860.

Primary Examiner—William L. Sikes
Assistant Examiner—Trong Phan

[57] ABSTRACT

A bucket brigade analog delay line with voltage limiting feedback includes an input stage for receiving an input signal and a series of delay stages coupled to the input stage for propagating the input signal through the line. Each delay stage contains a storage capacitor for holding either a signal charge or a reference charge, a transfer device for transferring charge from one stage to another at regular clock intervals, and a tap circuit for allowing external sampling of the propagated input signal. Each delay stage also includes a negative feedback amplifier for maintaining the drain terminal of the transfer device at a constant potential during charge transfer, thereby eliminating errors caused by finite output impedance of the transfer device. The negative feedback amplifier also prevents overvoltage conditions which could result in failure of the charge transfer devices.

22 Claims, 5 Drawing Sheets

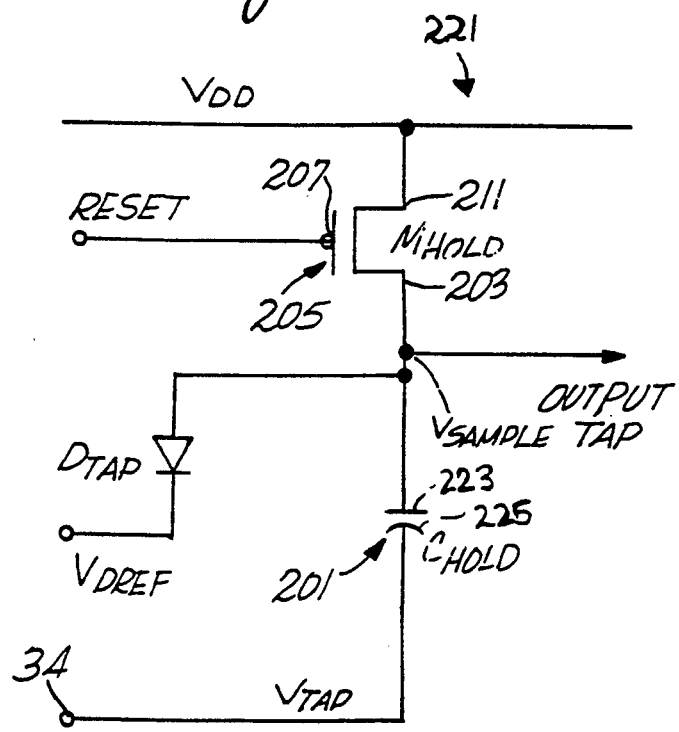

BUCKET BRIGADE ANALOG DELAY LINE WITH VOLTAGE LIMITING FEEDBACK

FIELD OF THE INVENTION

The present invention relates generally to delay lines and, more particularly, to a bucket brigade-type analog delay line incorporating negative feedback.

BACKGROUND OF THE INVENTION

Clocked analog delay lines are widely used in discrete time analog signal processing circuits. The delay lines operate to introduce a time lag in a signal, the lag being the time it takes the signal to pass through the line. One type of analog delay line, the conventional bucket brigade, has been particularly preferred since its introduction in the early 1970s due to its relatively simple design, compact topology, and low power consumption requirements.

Despite its benefits, the conventional bucket brigade suffers from at least three significant drawbacks which limit its desirability in modern high-speed integrated circuits. First, its transistors have long settling times, which slow its overall performance. Second, the low output impedance of the transistors can cause signal dependent errors. Finally, the conventional bucket brigade is susceptible to overvoltage conditions which can cause device failures in modern MOS technologies. It is desirable, therefore, to modify a delay line with simple, low-power, small-area circuits that ameliorate such drawbacks.

SUMMARY OF THE INVENTION

There is provided in practice of the present invention according to a presently preferred embodiment a bucket brigade analog delay line with voltage limiting feedback. The bucket brigade includes an input stage for receiving an input signal and a plurality of delay stages alternately connected to either a first clock or a second clock for propagating the signal through the line. Each delay stage contains a charge transfer device, a tap node for sampling of the propagated signal, a storage capacitor, the upper plate of which is connected to the tap node, and a clocked negative feedback amplifier connected between a lower plate of the capacitor and the tap node. In operation, the negative feedback amplifier eliminates the overvoltage conditions by maintaining voltages at the tap node within the clock voltage range. The bucket brigade with negative feedback also maintains a high impedance and increases overall performance of the line.

BRIEF DESCRIPTION OF THE DRAWINGS

These and other features and advantages of the present invention will be appreciated as the same becomes better understood by reference to the following discussion of the prior art and detailed description when considered in connection with the accompanying drawings, wherein:

FIG. 8 is a schematic diagram of an alternate embodiment of the high-speed tap circuit shown in FIG. 7.

DISCUSSION OF THE PRIOR ART

Figure 1:
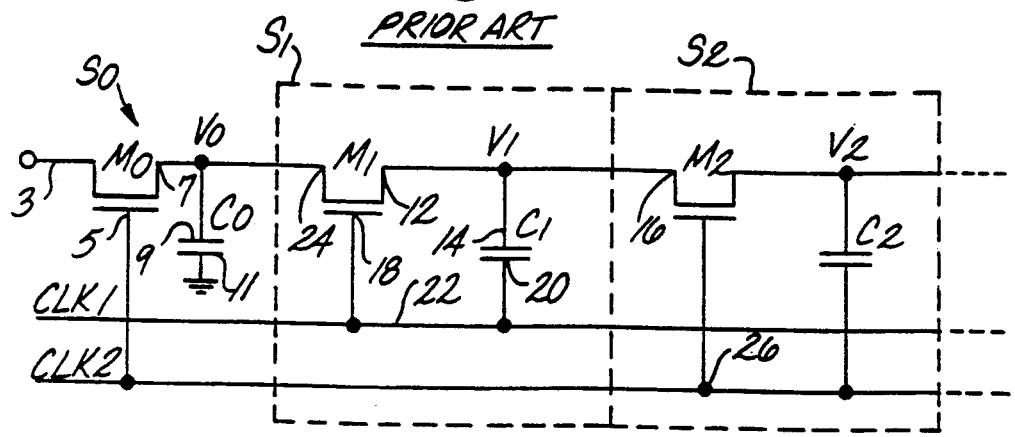
FIG. 1 is a schematic diagram of a prior art conventional bucket brigade analog delay line.

Referring to FIG. 1, a conventional bucket brigade analog delay line includes an input stage S0 coupled to a plurality of delay stages S1, S2,..., Sn. The input stage S0 includes an input FET M0 coupled to an input capacitor C0. An external input signal voltage is applied to the source 3 of M0. The gate 5 of M0 is coupled to a clock CLK2. The drain 7 of M0 is coupled to the upper plate 9 of C0. The lower plate 11 of C0 is connected to ground. (It should be noted throughout the specification that references to "upper plate" and "lower plate" of capacitors are merely used for convenience and have no significance with respect to the actual physical structure of the circuit.) In operation, the input FET M0 acts as a clocked switch for loading the input capacitor C0 with charge equivalent to the input signal voltage to be propagated through the delay line.

The delay stages S1, S2 shown are typical of a series of stages that together form the body of the delay line. A first delay stage S1, for example, contains a charge transfer device M1, preferably an n-channel enhancement-type MOSFET, a storage capacitor C1, and a tap node V1. The tap node V1 is connected to the drain 12 of the FET M1, the upper plate 14 of the storage capacitor C1, and the source 16 of the charge transfer FET M2 in the subsequent stage S2 of the line. The gate 18 of M1 and the lower plate 20 of C1 are each connected to a clock CLK1. The source 24 of M1 is connected to the node V0 in the previous stage S0. The second delay stage S2 of the line including M2, a storage capacitor C2, and a line tap V2 is substantially similar to the first delay stage S except that the second stage is connected to the clock node 26 of a second clock CLK2. Identical stages alternately clocked to CLK1 and CLK2 constitute the remainder of the delay line.

In general, the delay line operates to receive an input signal on the input stage of the delay line, for example, S0. The input charge is stored on the input capacitor C0 until the clocked transfer device M1 causes the input signal to be transferred from V0 to V1 during a charge transfer cycle (clock cycle). At the end of a subsequent charge transfer cycle, the input signal is passed from V1 to V2. These signal transfers cause the input signal to propagate through the tap nodes V1, V2,..., Vn of each successive stage. Thus, the input signal can be sampled at a particular tap node at the end of a charge transfer cycle to obtain a desired delay.

Figure 2:
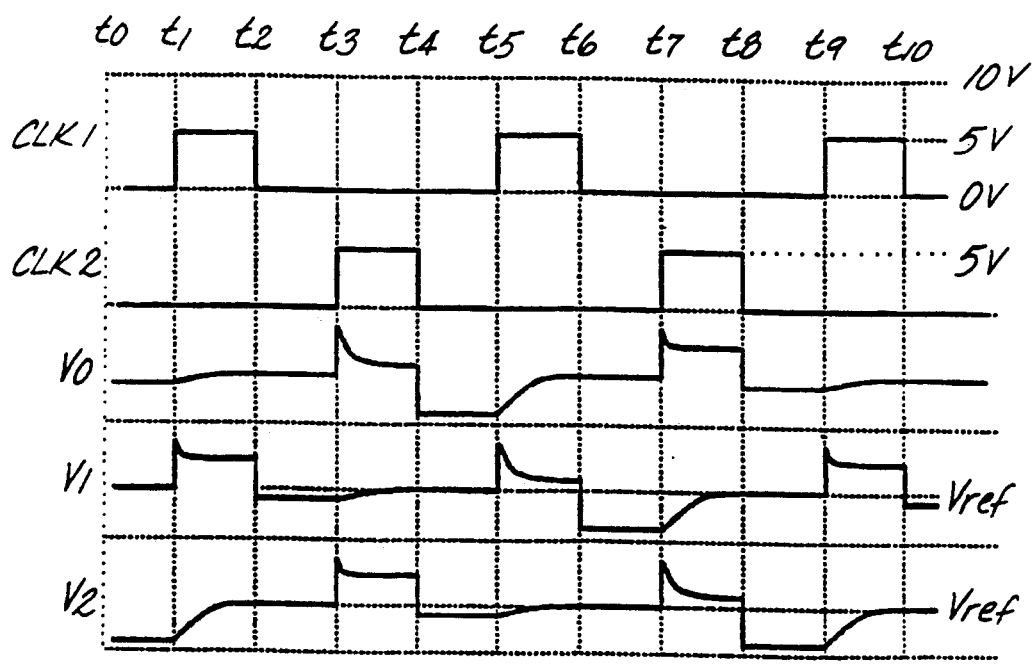
FIG. 2 is a timing diagram of the conventional bucket brigade shown in FIG. 1.

Referring to FIG. 2, a timing diagram for the conventional bucket brigade is shown. At time t0, capacitors C0 and C2 hold charges V0 and V2 equivalent to a sampled input voltage. C1 and all other odd-numbered capacitors (not shown) hold a reference charge and equivalent reference voltage $V_{ref}$ present as V1. In the conventional bucket brigade, $V_{ref}$ occupies a range larger than the sampled input voltage range. In this example, with a clock amplitude of 5V, $V_{ref}$ is equal to (5V-$V_t$). The threshold voltage $V_t$ is the gate to source voltage of the enhancement-type FETs at which drain current begins to flow. The threshold voltage $V_t$ inherent in the charge transfer FETs is approximately 1.5V. Thus, $V_{ref}$ is typically around 3.5V.

At t1, the output of clock CLK1 rises to an amplitude of 5V, bringing both the gate 18 of M1 and the lower plate 20 of C1 to 5V. This forces V1 to a potential of 5V plus the reference voltage $V_{ref}$. Since $V_{ref}$ is typically about 3.5V for nominal devices, V1 can go as high as 8.5V.

Also at t1, as the gate voltage of M1 increases, M1 turns on and C1 begins to discharge into C0. When VO rises to within a threshold drop of the gate voltage of M1 (i.e., when the gate to source voltage of M1 reaches $V_t$), M1 turns off and C1 is discharged no further. Assuming the capacitance of C1 equals that of Co, the voltage across Co will now be $V_{ref}$, the amount of charge previously held on C1, and the voltage across C1 will now be the signal voltage, the amount of charge previously held on CO.

At $tt_2$, both CLK1 and CLK2 go low, and M1 and M2 remain off. During this hold interval before CLK2 goes high at $t_3$, the voltages on each of the storage capacitors C1, C2,..., Cn are held constant and are available for sampling at each of the tap nodes V1, V2,...Vn. Since each storage capacitor cannot receive a new charge until it has passed the old one at the end of a given clock cycle, half the storage capacitors carry sampled input signals and the other half carry the reference charge $V_{ref}$.

At $t_2$, CLK2 goes high, and the signal present on V1 propagates to node V2 in substantially the same manner that charge was transferred between C0 and C1. V1 again returns to $V_{ref}$. A new signal, for example, may be input on node V0, ready to propagate through the line. The desired length of delay is obtained by sampling the voltage at a particular node along the line. The further the node from the beginning of the line, the longer the signal on a node has been delayed.

For accurate propagation of the sampled input signal from the beginning of the delay line only to its end (no taps), the reference voltage $V_{ref}$ may be different from stage to stage, so long as the voltage is constant for all the signal levels within a particular stage. However, in the case of a tapped delay line, for accurate reproduction of the sampled signal at each tap, the voltage $V_{ref}$ to which each stage serving as a tap is referenced must be exactly the same. If the reference voltages at each stage are not the same, there will be a DC offset at the taps and accurate sampling cannot occur. Variance within the delay line of the capacitor values can also lead to differences in gain at the taps. For this reason, in a tapped delay line, it is preferable for each capacitor to have the same capacitance and for the reference voltages at each stage to be identical.

Although the conventional bucket brigade has the benefits of relatively simple design, compact topology, and low power consumption requirements, the conventional bucket brigade suffers from drawbacks which limit its desirability in modern MOS technologies. First, the conventional bucket brigade line suffers from long settling time due to slow turn-off of the charge transfer devices M1, M2,..., Mn as capacitors C0, C1, C2,..., Cn are being charged. This limits the speed at which the delay line can be clocked.

The problem of long settling time can be overcome by using a ramped clock pulse, instead of a square wave pulse. This method is disclosed in an article entitled "Performance Limitations of the IGFET Bucket-Brigade Shift Register" by C.N. Berglund and H.J. Boll appearing in the IEEE Transactions on Electron Devices, Vol. ED-19, No. 7, July 1972, pp. 852-860.

A second drawback of the conventional delay line is the low output impedance of the FETs. In particular, error is introduced by the low output impedance of the transfer devices M1, M2,..., Mn. As VO reaches $V_{ref}$, V1 is discharged to 5 volts plus the signal voltage. Since the threshold voltage $V_t$ is a function of the drain-to-source voltage $V_{ds}$, particularly for short channel devices, the potential $V_{ref}$ to which C0 is charged will vary depending on the signal level being transferred. The low output impedance introduces a first order error proportional to the difference between adjacent signal sample values. The absolute error is worst when two adjacent signal samples differ by the maximum input signal range. Moreover, this error is additive, and the resulting charge dispersion increases by each shift as the signal propagates through the delay line. For example, in a typical one micrometer gate length device having a maximum sample-to-sample difference of one volt, the error introduced by a single stage can be as high as 25 to 50 millivolts. This error can be reduced by replacing M1 with a cascode pair. However, using a cascode pair reduces the maximum signal swing to clock amplitude ratio and, therefore, reduces the dynamic range of the overall delay line.

A third drawback of the conventional bucket brigade is due to overvoltage conditions. The peak voltage of 8.5V found in the bucket brigade of the above example violates the maximum internal voltage specifications of modern sub-micron devices. Modern MOS processes typically do not tolerate more than 5V between the drain and source of the device because voltages in excess of 5V exceed the breakdown voltage of the devices. This intolerance is due to hot-electron effects and other high-field phenomena typical of sub-micron, thin gate oxide MOS devices.

The problem of exceeding the breakdown voltage of modern devices can be reduced in a number of ways, but each has drawbacks. For example, the peak voltage of the clock pulse can be reduced, but this would significantly degrade the maximum signal swing and dynamic range of the delay line. The peak voltage can also be reduced by increasing the rise time of the clock pulse allowing C1 to partially discharge before the clock reaches its peak value, but this leads to lower clock frequencies and does not entirely eliminate the overvoltage problem.

DETAILED DESCRIPTION

Figure 3:
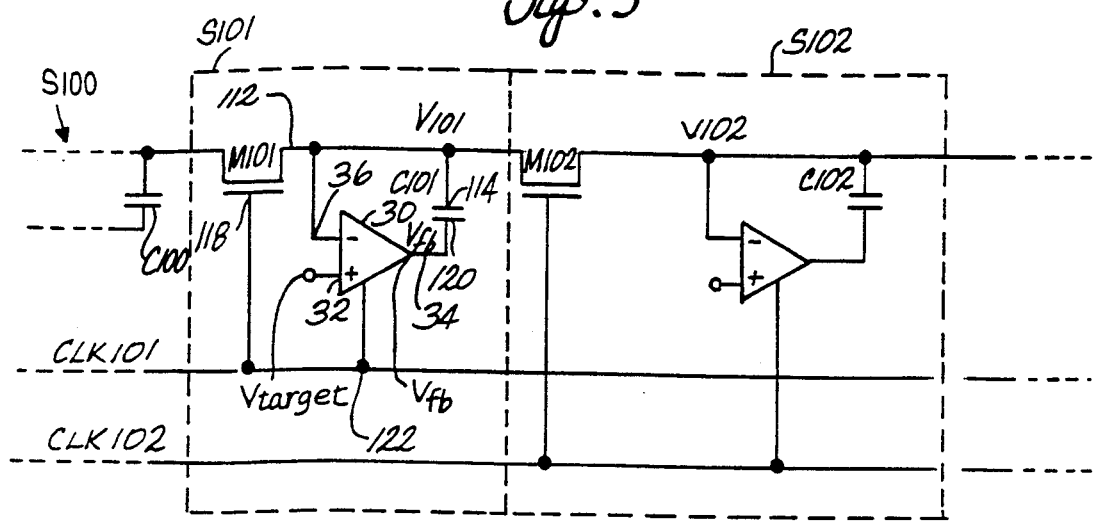
FIG. 3 is a schematic diagram of a bucket brigade analog delay line with voltage limiting feedback according to the present invention.

Referring to FIG. 3, the bucket brigade analog delay line with voltage limiting feedback according to the present invention addresses all or some of the drawbacks inherent in the conventional bucket brigade.

The schematic of the bucket brigade according to the present invention is similar to the conventional bucket brigade shown in FIG. 1. For clarity, similar components in FIG. 1 and FIG. 3 have numbers offset by a factor of one hundred. Unlike the conventional bucket brigade, the bucket brigade according to the present invention contains a clocked high-gain feedback amplifier 30 in each stage S101, S102,...Sn, added, for example, in representative stage S101 between the clock node 122 of CLK101 and the lower plate (more negative node) 120 of the storage capacitor C101. One feedback amplifier is contained in each stage of the bucket brigade; the amplifier in each stage is connected to either CLK101 or CLK102 in alternating fashion.

Figure 4:
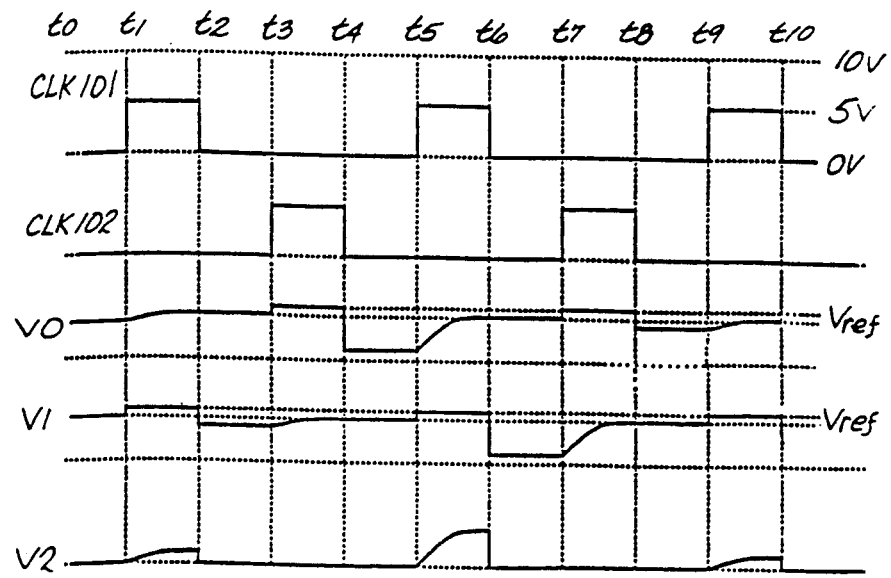
FIG. 4 is a timing diagram of the bucket brigade delay line shown in FIG. 3.

Referring also to the timing diagram in FIG. 4, in operation, the bucket brigade according to the present invention eliminates both the overvoltage problem and $V_t$ vs. $V_{ds}$ dependence error (caused by low output impedance) found in the conventional bucket brigade. At t1, when the clock signal CLK101 is driven to 5V, the feedback amplifier is enabled and adjusts the feedback potential $V_{fb}$ on the lower plate 120 of the capacitor C101 as necessary to keep V101 at a constant potential $V_{TARGET}$ applied to the noninverting input 32 of the feedback amplifier. As C101 discharges into C100 within a clock cycle, the feedback potential $V_{fb}$ at the output 34 of the amplifier is driven positive. Since the charge transfer devices are preferably enhancement-type FETs, the amplifier maintains the voltage on the drain 112 of M101 equal to $V_{TARGET}$. This is sufficient for maintaining the transfer device M101 in the active region during the charge transfer.

Conversely, at t2, when CLK101 is driven downward at the end of a pulse, the clocked amplifier is disabled, and the feedback potential $V_{fb}$ goes to ground. This limits the peak voltages during a cycle to within the clock voltage range. This operation eliminates the overvoltage stress on the MOS devices and alleviates device failure concerns. In addition, since the feedback amplifier maintains the same potential on the drain 112 of M101 from cycle to cycle, the threshold voltage $V_t$ of the charge transfer device will remain constant for all signal levels. Consequently, $V_{ref}$ will be constant for all signal levels, thereby eliminating the $V_t$ vs. $V_{ds}$ dependence error. As an added benefit, if the amplifier has sufficiently high gain, additional cascode devices are not necessary as required in the prior art. This maintains the dynamic range of the circuit.

The gain in each of the feedback amplifiers should also be sufficiently high to hold the potential V101 at the target potential $V_{TARGET}$ for different signal levels. Without such stability, significant $V_t$ vs. $V_{ds}$ dependence induced error would result. To raise the gain, a single cascode element can be added in series with the transfer device. This, however, lowers the dynamic range of the line. A better approach, incorporated into the present invention, is to improve the gain of the negative feedback amplifier 30. This generally would require an expensive and complex amplifier. However, due to the particular requirements of the bucket brigade according to the present invention, a high-gain amplifier can be implemented with significantly reduced complexity.

Figure 5:
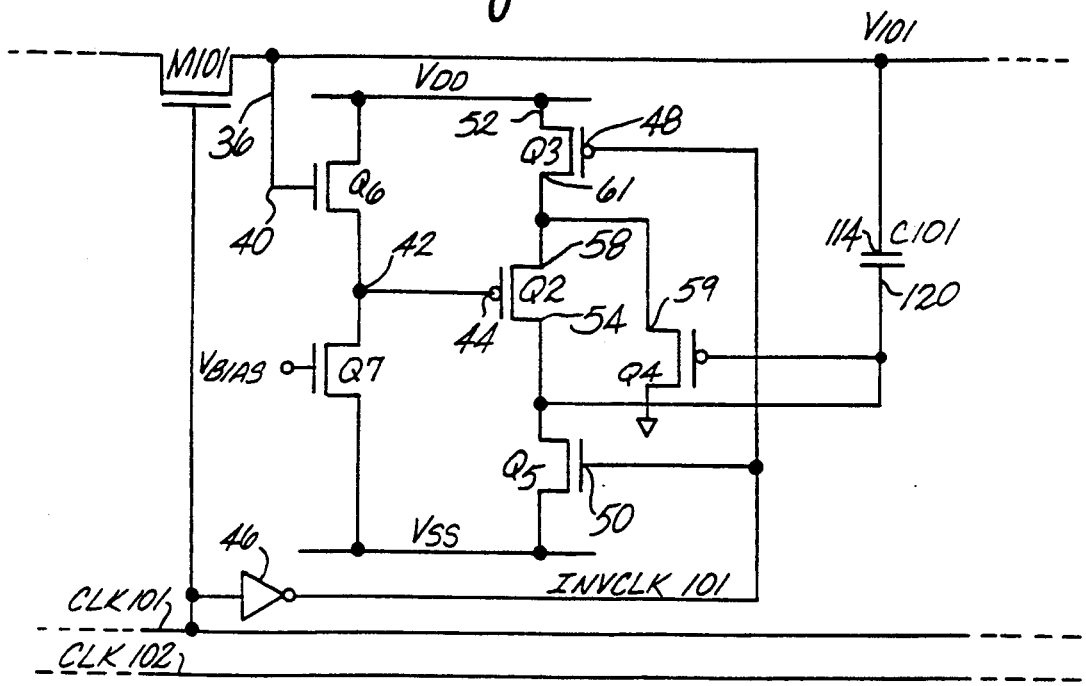
FIG. 5 is a schematic diagram of a voltage limiting feedback amplifier according to the present invention.

Referring to FIG. 5, a clocked high-gain negative feedback amplifier according to the present invention is shown. The inverting input 36 of the amplifier 30 is the input 40 to a level shifting source follower including an n-channel FET Q6 and its active load Q7 biased by a voltage $V_{BIAS}$. The output 42 of the source follower is connected to the gate 44 of a p-channel gain FET Q2 for proper biasing of Q2.

The clock signal from CLK101, inverted by invester 46 to produce a signal INVCLK101, is delivered to the gates 48, 50 of a p-channel FET Q3 and an n-channel FET Q5. During a clock pulse of CLK101 when INVCLK101 is low, Q3 is on and delivers current to the gain FET Q2. N-channel device Q5 is off during a CLK101 pulse; Q5 sees a low signal INVCLK101 at its gate 50. Conversely, when CLK101 is low, Q5 sees a high INVCLK101 signal, turns on, and pulls the lower plate 120 of the storage capacitor C101 to $V_{SSSS}$. Device Q5 is actually a multi-drain device (not shown) with the other drain nodes connected to the gate 44 of Q2 and drain 61 of Q3. These connections eliminate charge coupling errors when CLK101 is low.

During the CLK101 pulse, Q2 serves as a common-source amplifier with unbypassed source resistance provided by Q3. The p-channel FET Q3 is biased in the triode region during the CLK101 pulse. The negative feedback path is from the gate 44 to drain 54 of Q2, through the storage capacitor C101, and from the input gate 40 to the source of Q6 back to the gate 44 of Q2.

As C101 discharges through M101 into the storage capacitor C100 of the previous bucket brigade stage, the voltage V101 tends to decrease, thereby reducing the gate voltage of the gain FET Q2. This reduction increases the gate to source drive of the p-channel FET Q2, causing it to increase the current driven into the lower plate 120 of C101. The effect of this operation is to counteract the decreasing voltage on V101. In this manner, the negative feedback loop maintains a quasi-constant voltage at node V101 within the range of the clock pulse signals.

In the circuit described, Q2 is the only gain element in the amplifier. If this gain is not sufficiently high, the voltage V101 will not be held constant because the output current from Q2 driven into the lower plate 120 of C101 will not be able to counteract the decreasing voltage V101 as C101 discharges into C100.

To enhance the gain of Q2, positive feedback FET Q4 is added to the circuit. The positive feedback FET Q4 creates positive feedback around Q2, effectively moving the low-gain voltage error at node V101 to the source node 58 of Q2.

Use of positive feedback within the amplifier increases its overall gain. Assuming the sampled input voltage at V101 decreases, the gate voltage of the gain FET Q2 will also decrease. The drain voltage of Q2 will, therefore, increase in voltage, and the gate of Q4 will also see a voltage increase. Because Q4 is a p-channel device, as the voltage on the gate of positive feedback FET Q4 goes higher, its current will decrease. The voltage drop across Q3 will also decrease. This will cause the voltage at the common sources 58, 59 of Q2 and Q4 to increase due to the decreasing voltage drop across Q3. As the drain 61 of Q3 moves positive, the source 58 of Q2 also goes positive, thus increasing the magnitude of the gate to source voltage $V_{gs}$, of Q2. Consequently, the action of device Q4 helps amplify the gain of Q2 through positive feedback.

Figure 6:
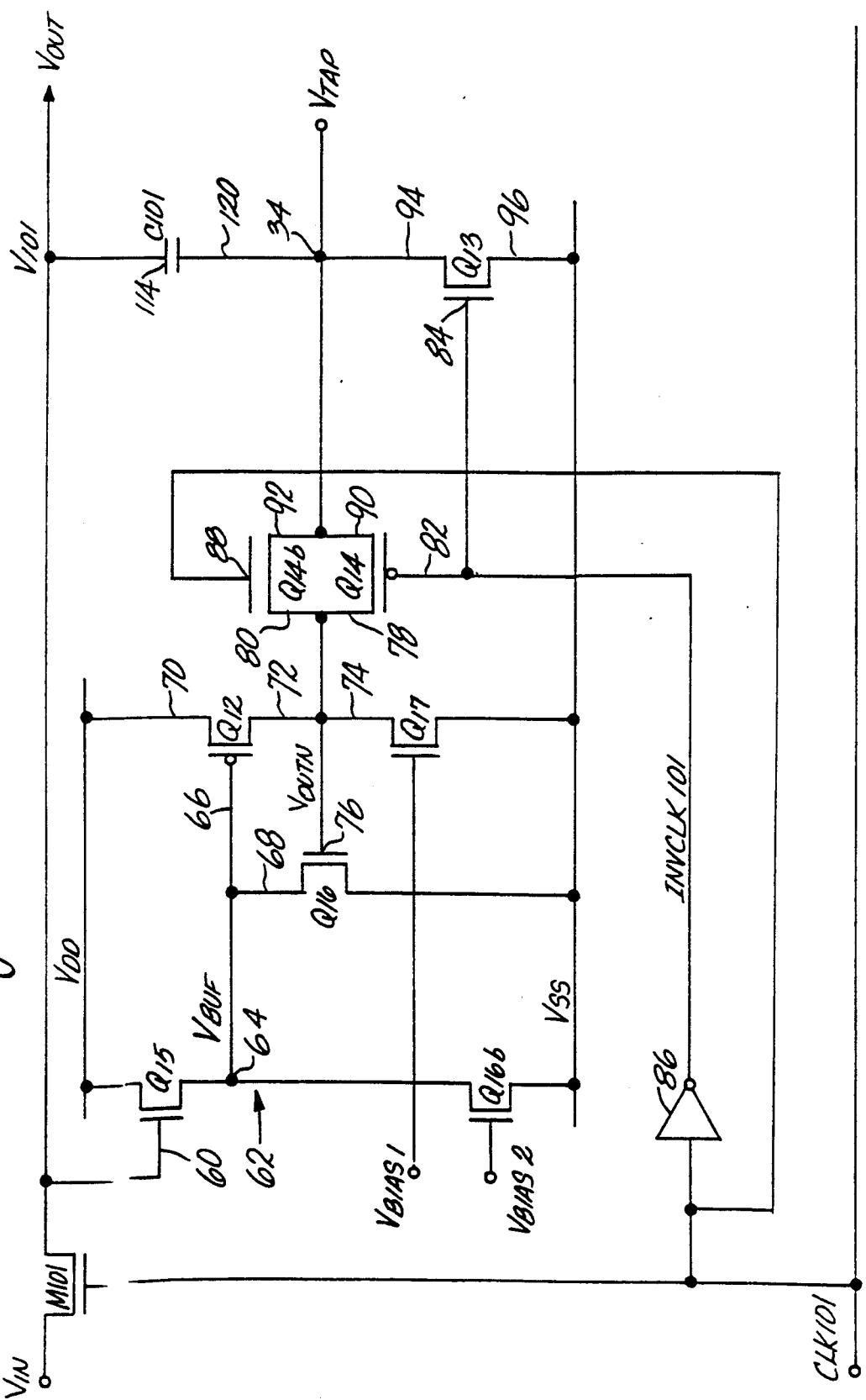
FIG. 6 is a schematic diagram of an alternate embodiment of the voltage limiting feedback amplifier shown in FIG. 5.

Referring to FIG. 6, an alternate embodiment of the clocked, high-gain, negative feedback amplifier of FIG. 5 is shown. As with the embodiment of FIG. 5, this alternate embodiment provides sufficient gain to counteract voltage increases at the tap nodes, thereby eliminating the overvoltage condition. The inverting input 36 to the amplifier 30 (FIG. 3) is the input 60 to a source follower circuit 62, including Q15 and its load Q16b. The source follower output 64 is connected to the gate 66 of a p-channel gain FET Q12 and the drain 68 of an n-channel FET Q16. The purpose of the source follower is to provide a voltage $V_{BUF}$ at the gate of the gain FET Q12 for properly biasing Q12.

Common source connected Q12 and its load Q17 provide the bulk of gain for the amplifier. The source 70 of Q12 is connected to the upper rail $V_{DD}$. The drain 72 of Q12 is connected to the drain 74 of Q17, the gate 76 of the positive feedback FET Q16, and the common sources 78, 80 of coupled FET switches Q14 and Q14b.

The gate 82 of p-channel FET Q14 is connected to the gate 84 of an n-channel FET Q13 and an invertor 86 which provides the inverted clock signal INVCLK101. The gate 88 of an n-channel FET Q14b is coupled directly to CLK101. The common drains 90, 92 of FET switches Q14 and Q14b are connected to the drain 94 of Q13 and form the output 34 of the amplifier 30 (FIG.3) at the node $V_{TAP}$. The source 96 of Q13 is connected to the lower rail $V_{SS}$.

In operation, the source follower Q15 and its load Q16b act as a level shifter for proper bias of Q12. The FETs Q13 and Q14 are clocked by the inverted version of clock CLK1. Devices Q14 and Q14b are enabled by INVCLK101 and CLK101 during a charge transfer cycle to connect the output of the amplifier to the lower terminal of C101. When Q14 and Q14b are disabled, Q13 is driven on by INVCLK101 to connect the lower terminal of C101 to $V_{SS}$. This allows C101 to be charged to the reference potential by the next stage in the delay line.

When CLK101 is driven high, Q13 is off, and the amplifier output is connected to the lower plate 120 of C101 via Q14 and Q14b. For simplicity, first consider operation of the circuit without the positive feedback device Q16. If $V_{OUT}$ decreases, the buffered signal $V_{BUF}$ will decrease as well. Decreasing the Q12 gate potential increases the current flowing through Q12 into the equivalent load at $V_{TAP}$ (assuming Q14 and Q14b form a short circuit when enabled). As a result, the decrease of the voltage $V_{OUT}$ will be negated. The potential which the amplifier attempts to maintain at $V_{OUT}$ is set by appropriately sizing the amplifier devices and adjusting the bias voltages $V_{BIAS1}$ and $V_{BIAS2}$ at the gates of Q17 and Q16b, respectively.

Without the positive feedback device Q16, the amplifier is a simple common-source negative feedback amplifier with a source follower level shifter on the input. The forward gain of the amplifier is fairly low ($\approx 25V/V$). As a result of this low forward gain, $V_{OUT}$ will vary by about 40 mV for 1V variations in the signal voltage across C101. As described earlier, variations in $V_{OUT}$ (the drain potential of the charge transfer device M101) will lead to a variation in the reference potential to which the preceding stage storage capacitor C100 (FIG. 3) is charged. Variations in the reference potential lead to a dipersive error in the delay line. To reduce the variation in $V_{OUT}$, it is necessary to increase the forward gain of the amplifier.

To enhance the gain of the amplifier without adding multiple gain stages (and the accompanying stability problems), the positive feedback device Q16 is added to introduce positive feedback around the gain device Q12. The effect of Q16 is to move the error from the $V_{OUT}$ node to the gate of Q12. Again, consider the case where some stimulus attempts to reduce $V_{OUT}$ As indicated previously, the decrease in $V_{OUT}$ decreases $V_{BUF}$ at node 64, which increases the current through Q12 and decreases the potential at $V_{TAP}$. As $V_{TAP}$ is increased, the gate drive of Q16 is increased which, in turn, increases the current through Q15, further increasing the gate drive of Q12. In this manner, Q16 effectively increases the gain of Q12. If Q16 is sized properly, the gain of the amplifier can theoretically be raised to infinity. Of course, in practice, the gain is best described as very large.

In operation, the device Q16b is important for maintaining stability of V101 and ensuring current flow through Q15 for all operating conditions. The voltages $V_{BIAS1}$ and $V_{BIAS2}$ can be used to control both the error at $V_{OUT}$ and the potential which the amplifier attempts to maintain at $V_{OUT}$ for variations in process and temperature. To allow further fine-tuning of the positive feedback of the amplifier, $V_{BIAS1}$ may be applied to the gates of both Q16b and Q17, and $V_{BIAS2}$ may be applied to a gate of a FET (not shown) coupled between Q16 and the lower rail $V_{SS}$.

In the conventional bucket brigade and the bucket brigade according to the present invention, a hold interval exists between successive clock pulses. This hold period allows time for the voltage on the bucket brigade capacitor to be sampled by a high-impedance buffer (not shown). However, this hold time also reduces the maximum shift rate of the bucket brigade analog delay lines by adding to the total clock period. This reduces the speed of the circuit.

Figure 7:
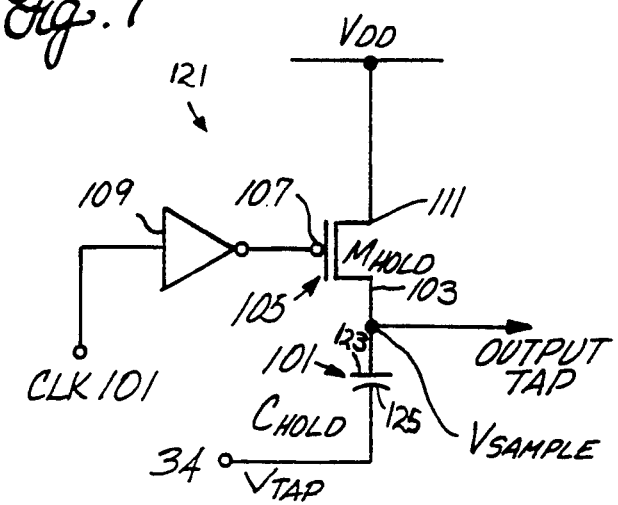
FIG. 7 is a schematic diagram of a high-speed tap circuit for use with a bucket brigade delay line according to the present invention.

Referring to FIG. 7, a high-speed tap circuit 121 according to the present invention maintains a delayed input signal for sampling at any given stage for an extended period of half a clock cycle. The high-speed tap circuit can be readily attached to any output node 34 of the feedback amplifiers (also $V_{TAP}$ in FIG. 6). The tap circuit contains a hold capacitor $C_{HOLD}$ 101 for holding charge. The lower plate 125 of $C_{HOLD}$ is connected to the output node 34. The upper plate 123 of $C_{HOLD}$ is connected to a sampling node $V_{SAMPLE}$ from which the signal may be sampled. The $V_{SAMPLE}$ node is connected to the drain 103 of a p-channel signal hold FET $M_{HOLD}$ 105. The gate 107 of $M_{HOLD}$ is connected to an inverter 109 which inverts clock signal CLK101. The source 111 of $M_{HOLD}$ is connected to the upper rail $V_{DD}$.

The high-speed tap circuit further enhances the operation of the bucket brigade according to the present invention. The point of the high-speed tap circuit shown in FIG. 7 is to avoid the hold delay which occurs between CLK101 and CLK102 between, for example, $t_2$ and $t_3$ (FIG. 4). The hold delay is present to allow an external sampling of the voltages. The tap node voltages must be held for some finite amount of time so they may be sampled through, for example, a high-impedance buffer. During the charge transfer, the high-speed tap circuit 121 allows the sampled input voltage to be copied at the end of each cycle. During charge transfer, the copy of the signal on the storage capacitor C101 is held on $C_{HOLD}$. When the next cycle begins, the copy is held for half of a clock cycle. The upper rail $V_{DD}$ and the signal hold FET $M_{HOLD}$ serve to hold the upper plate of $C_{HOLD}$ at a potential equal to the potential of the upper plate of C101 except for a dc offset equal to $V_{DD}-V_{TARGET}$. This forces the capacitors to take the same signal charge. The sampling node $V_{SAMPLE}$ sees this charge and can be sampled by an external circuit. Therefore, since $M_{SAMPLE}$ holds the signal for half a clock cycle, no added hold time is necessary between successive clock cycles. This increases the overall performance of the delay line.

In operation, the high-speed tap circuit shown in FIG. 7 is very sensitive to the slope of the clock voltage (e.g., CLK101) at the gate 107 of $M_{HOLD}$. If the falltime at the gate of $M_{HOLD}$ is large, device Q13 (FIG. 6) and $M_{HOLD}$ will be on at the same time. This will cause $C_{HOLD}$ to be inappropriately charged, thereby destroying the signal to be sampled. To avert this failure, the voltage at the gate of $M_{HOLD}$ must have a short falltime (i.e., the clock pulse must approach an ideal square wave).

Referring to FIG. 8, an alternate embodiment of the high-speed tap circuit removes the constraint of having a clock voltage input to the holding FET $M_{HOLD}$ 205 (105 in FIG. 7) with a very short falltime. The layout of the high-speed circuit 221 of FIG. 8 is similar to that of FIG. 7, except that a voltage RESET is applied to the gate 207 of $M_{HOLD}$, instead of the clock voltage. Moreover, a diode $D_{TAP}$, referenced to a voltage $V_{DREF}$, is connected to the sampling node $V_{SAMPLE}$. For clarity, similar components in FIG. 7 and FIG. 8 have reference numerals offset by a factor of one hundred.

In operation, the RESET signal is a short pulse whose exact characteristics are not critical. The short RESET pulse turns $M_{HOLD}$ 205 on briefly to reset the charge across $C_{HOLD}$ 201. At this point, the voltage $V_{SAMPLE}$ at the OUTPUT TAP has been raised to a high enough potential relative to the potential $V_{DREF}$ to turn on the diode $D_{TAP}$. When $M_{HOLD}$ turns off, the diode $D_{TAP}$ carries the current that previously flowed through $M_{HOLD}$ for the rest of the charge transfer cycle (i.e., the cycle during which charge is transferred between adjacent delay stages). At the end of the cycle, as Q13 (FIG. 6) turns on to pull the lower plate 120 of the storage capacitor C101 (FIG. 6) to ground, the potential $V_{SAMPLE}$ at the OUTPUT TAP is pulled low, and $D_{TAP}$ turns off. This circuit avoids the possibility of undesired charging of $C_{HOLD}$ at the end of the charge transfer cycle and results in improved overall performance of the bucket brigade according to the present invention.

While a description of various embodiments of the present invention have been shown and described, it will be understood that various other adaptations and modifications may be made without departing from the scope of the invention. For example, the negative feedback amplifier may be implemented with conventional operational amplifier topology or the charge transfer devices may be implemented using BiCMOS technology. Also, the negative feedback amplifiers may be shared between adjacent stages to conserve power.

What is claimed is:

1. A clocked bucket brigade analog delay line having an input stage for receiving a signal and a plurality of delay stages coupled to the input stage for propagating the signal through the line, each delay stage comprising:
    a charge transfer device having gate, drain, and source electrodes;
    a storage capacitor having upper and lower plates;
    a tap node connected to the drain of the charge transfer device and the upper plate of the storage capacitor; and
    a negative feedback amplifier having an input connected to the tap node and an output connected to the lower plate of the storage capacitor for introducing negative feedback into the delay line stage.

2. The bucket brigade analog delay line of claim 1 wherein the charge transfer device is an n-channel enhancement-type MOSFET.

3. The bucket brigade analog delay line of claim wherein the negative feedback amplifier comprises a plurality of transistors incorporating positive feedback.

4. The bucket brigade analog delay line of claim wherein the negative feedback amplifier comprises:
    a gain FET; and
    a positive feedback FET coupled to the gain FET for introducing positive feedback around the gain FET.

5. The bucket brigade analog delay line of claim 4 wherein the gain FET is a p-channel MOSFET.

6. The bucket brigade analog delay line of claim 4 wherein the positive feedback device is an n-channel MOSFET.

7. The bucket brigade analog delay line of claim 1 and further comprising a high-speed tap circuit coupled to the negative feedback amplifier output for holding the signal for sampling.

8. The bucket brigade analog delay line of claim 7 wherein the high-speed tap circuit comprises:
    a holding capacitor having upper and lower plates, the lower plate of the holding capacitor being connected to the negative feedback amplifier output; and
    a signal hold FET coupled to the upper plate of the holding capacitor for causing potential across the holding capacitor to become substantially equal to potential across the storage capacitor.

9. The bucket brigade analog delay line of claim 8 wherein the high-speed tap circuit further comprises a sampling node coupled between the upper plate of the holding capacitor and the signal hold FET for allowing external sampling of the signal.

10. The bucket brigade analog delay line of claim 9 wherein the high-speed tap circuit further comprises a diode coupled to the signal hold FET for carrying current away from the signal hold FET.

11. A bucket brigade analog delay line having a plurality of stages for receiving and propagating an input signal through the line at regular intervals defined by at least one clock having a clock voltage range, each stage comprising:
    storage capacitor;
    a charge transfer device having a drain coupled to the storage capacitor for transferring charge on the storage capacitor to an adjacent stage;
    a tap node connected to the storage capacitor and charge transfer device;
    a voltage limiting negative feedback amplifier connected to the tap node, storage capacitor, and the clock for holding the drain of the charge transfer device at a constant potential while the charge on the storage capacitor is being transferred to an adjacent stage.

12. The bucket brigade analog delay line of claim 11 wherein the voltage limiting negative feedback amplifier comprises:
    a gain FET for providing amplifier gain; and
    a level shifting source follower coupled to the gain FET for biasing the gain FET.

13. The bucket brigade analog delay line of claim wherein the voltage negative feedback device further comprises a positive feedback FET coupled to the gain FET for enhancing the amplifier gain.

14. The bucket brigade analog delay line of claim 12 wherein the voltage limiting negative feedback amplifier further comprises means for applying bias voltages to the negative feedback amplifier for adjusting the voltage on the tap node.

15. A bucket brigade analog delay line for delaying the passage of a signal through a circuit, the delay line comprising:
    an input stage for receiving an input signal having an input signal voltage range; and a plurality of delay stages coupled to the input stage for propagating the signal through the line, each delay stage having a tap node for sampling the propagated signal during a prescribed sampling interval and a feedback device having an output node for maintaining voltage at the tap node within a predefined clock voltage range.

16. The bucket brigade analog delay line of claim 15 wherein the feedback device is a negative feedback amplifier coupled to the clock.

17. The bucket brigade analog delay line of claim 15 wherein each delay stage further comprises a high-speed tap circuit coupled to the output node for storing the propagated signal for a period of time equal to half the period of a sampling clock.

18. The bucket brigade analog delay line of claim 17 wherein the sampling clock is coupled to the feedback device and high-speed tap circuit for defining rate at which the input signal is propagated through the delay line.

19. The bucket brigade analog delay line of claim 17 wherein the high-speed tap circuit comprises a holding capacitor coupled to a signal hold FET for controlling charging and discharging of the holding capacitor.

20. The bucket brigade analog delay line of claim 19 further comprising means for applying a pulse to the signal hold FET.

21. A bucket brigade analog delay line comprising:
at least one charge transfer device having first, second, and third electrodes;
at least one capacitor having first and second plates, the first plate of the capacitor coupled to the first electrode of the charge transfer device; and
at least one amplifier coupled between the second plate of the capacitor and the first electrode for introducing negative feedback into the delay line.

22. The bucket brigade analog delay line of claim 21 further comprising at least one clock coupled to the second electrode of the charge transfer device and to the amplifier for propagating a signal through the delay line.

* * * * *